(12) United States Patent
Liu (10) Patent No.: US 11,177,296 B2
(45) Date of Patent: Nov. 16, 2021

(54) ARRAY SUBSTRATE, DISPLAY DEVICE, THIN FILM TRANSISTOR, AND METHOD FOR MANUFACTURING ARRAY SUBSTRATE

(71) Applicants: Hefei Xinsheng Optoelectronics Technology Co., Ltd., Hefei (CN); BOE Technology Group Co., Ltd., Beijing (CN)

(72) Inventor: Ning Liu, Beijing (CN)

(73) Assignees: Hefei Xinsheng Optoelectronics Technology Co., Ltd., Anhui (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/644,261

(22) PCT Filed: Apr. 17, 2019

(86) PCT No.: PCT/CN2019/083096
§ 371 (c)(1),
(2) Date: Mar. 4, 2020

(87) PCT Pub. No.: WO2019/210776
PCT Pub. Date: Nov. 7, 2019

(65) Prior Publication Data
US 2020/0203391 A1 Jun. 25, 2020

(30) Foreign Application Priority Data
May 3, 2018 (CN) .......................... 201810415015.2

(51) Int. Cl.
*H01L 21/00* (2006.01)
*H01L 27/00* (2006.01)
(Continued)

(52) U.S. Cl.
CPC .... *H01L 27/1248* (2013.01); *H01L 21/02181* (2013.01); *H01L 21/02183* (2013.01);
(Continued)

(58) Field of Classification Search
CPC ......... H01L 21/02181; H01L 21/02183; H01L 21/02244; H01L 21/02252; H01L 27/1288;
(Continued)

(56) References Cited

U.S. PATENT DOCUMENTS 5,614,728 A * 3/1997 Akiyama ................ H01L 27/12
257/347
7,088,401 B1 * 8/2006 Ihara ................ G02F 1/136213
257/72

(Continued)

FOREIGN PATENT DOCUMENTS

CN 102646699 A 8/2012
CN 102812555 A 12/2012
(Continued)

OTHER PUBLICATIONS

Jul. 24, 2020—(CN) Second Office Action Appn 201810415015.2 with English translation.

*Primary Examiner* — Nikolay K Yushin
(74) *Attorney, Agent, or Firm* — Banner & Witcoff, Ltd.

(57) ABSTRACT

An array substrate, a display device, a thin film transistor, and a method for manufacturing an array substrate are disclosed. The array substrate includes a base substrate, an active layer, and a cover layer. The active layer is on the base substrate, the cover layer is on a side, away from the base substrate, of the active layer and covers the array substrate, the cover layer includes a metal conductive portion and a transparent insulating metal oxide portion, the metal conductive portion and the transparent insulating metal oxide (Continued)

portion include an identical metal element, and the metal conductive portion is electrically connected to the active layer.

18 Claims, 3 Drawing Sheets

(51) Int. Cl.
| | | |
|---|---|---|
| *H01L 29/00* | (2006.01) | |
| *H01L 27/12* | (2006.01) | |
| *H01L 21/02* | (2006.01) | |
| *H01L 29/66* | (2006.01) | |
| *H01L 29/786* | (2006.01) | |

(52) U.S. Cl.
CPC ...... *H01L 21/02244* (2013.01); *H01L 27/124* (2013.01); *H01L 27/1225* (2013.01); *H01L 27/1288* (2013.01); *H01L 29/66969* (2013.01); *H01L 29/7869* (2013.01); *H01L 21/02252* (2013.01)

(58) Field of Classification Search
CPC ............. H01L 27/1225; H01L 27/1248; H01L 27/124; H01L 29/66969; H01L 29/7869; H01L 29/4908; H01L 29/40114
See application file for complete search history.

(56) References Cited

U.S. PATENT DOCUMENTS

| | | | |
|---|---|---|---|
| 9,355,838 B2 | 5/2016 | Wang et al. | |
| 9,842,915 B2 | 12/2017 | Beak et al. | |
| 2008/0111132 A1 | 5/2008 | Wang | |
| 2009/0309102 A1 | 12/2009 | Kim et al. | |
| 2013/0037807 A1 | 2/2013 | Fukaya | |
| 2017/0154905 A1* | 6/2017 | Yuan | C23C 30/00 |
| 2020/0203391 A1 | 6/2020 | Liu | |

FOREIGN PATENT DOCUMENTS

| | | | | |
|---|---|---|---|---|
| CN | 104600077 A | | 5/2015 | |
| CN | 108615735 A | | 10/2018 | |
| WO | WO2016/179951 | * | 11/2016 | ........................ 21/34 |

* cited by examiner

ARRAY SUBSTRATE, DISPLAY DEVICE, THIN FILM TRANSISTOR, AND METHOD FOR MANUFACTURING ARRAY SUBSTRATE

The application is a U.S. National Phase Entry of International Application No. PCT/CN2019/083096 filed on Apr. 17, 2019, designating the United States of America and claiming priority to Chinese Patent Application No. 201810415015.2, filed on May 3, 2018. The present application claims priority to and the benefit of the above-identified applications and the above-identified applications are incorporated by reference herein in their entirety.

TECHNICAL FIELD

Embodiments of the present disclosure relate to an array substrate, a display device, a thin film transistor, and a method for manufacturing an array substrate.

BACKGROUND

The thin film transistor (TFT) is one of the types of the field effect transistor and is mainly used in the tablet display device. Among tablet display devices, thin film transistor liquid crystal displays (TFT-LCD) have occupied a dominant position in the current tablet display market. In the TFT-LCD production process, the array process is mainly used to manufacture TFT substrates and color filters.

SUMMARY

At least an embodiment of the present disclosure provides an array substrate, and the array substrate includes a base substrate, an active layer, and a cover layer; and the active layer is on the base substrate, the cover layer is on a side, away from the base substrate, of the active layer and covers the array substrate, the cover layer includes a metal conductive portion and a transparent insulating metal oxide portion, the metal conductive portion and the transparent insulating metal oxide portion include an identical metal element, and the metal conductive portion is electrically connected to the active layer.

For example, in the array substrate provided by an embodiment of the present disclosure, the metal conductive portion includes a first electrode and a second electrode, and the first electrode and the second electrode are opposite and are electrically connected to the active layer, respectively.

For example, in the array substrate provided by an embodiment of the present disclosure, the metal conductive portion further includes a data line, the first electrode is a source electrode, the second electrode is a drain electrode, and the data line is electrically connected to the source electrode.

For example, the array substrate provided by an embodiment of the present disclosure further includes a gate electrode, a gate line, and a gate insulating layer; and the gate electrode is on the base substrate and is electrically connected to the gate line, the gate insulating layer is on a side, away from the base substrate, of the gate electrode and the gate line, and the active layer is on a side, away from the gate electrode, of the gate insulating layer.

For example, in the array substrate provided by an embodiment of the present disclosure, the metal conductive portion of the cover layer includes Hf, and the transparent insulating metal oxide portion of the cover layer includes $HfO_2$.

For example, in the array substrate provided by an embodiment of the present disclosure, the metal conductive portion of the cover layer includes Ta, and the transparent insulating metal oxide portion of the cover layer includes $Ta_2O_5$.

For example, in the array substrate provided by an embodiment of the present disclosure, a material of the active layer includes a metal oxide semiconductor, and the metal oxide semiconductor includes indium gallium zinc oxide, zinc oxide, or zinc oxynitride.

For example, the array substrate provided by an embodiment of the present disclosure further includes a passivation layer, and the passivation layer is on a side, away from the active layer, of the cover layer.

At least an embodiment of the present disclosure further provides a display device, and the display device includes the array substrate provided by any one of the embodiments of the present disclosure.

At least an embodiment of the present disclosure further provides a method for manufacturing an array substrate, including: forming an active layer on a base substrate, and forming a cover layer covering the array substrate on a side, away from the base substrate, of the active layer; and the cover layer includes a metal conductive portion and a transparent insulating metal oxide portion, the metal conductive portion and the transparent insulating metal oxide portion include an identical metal element, and the metal conductive portion is electrically connected to the active layer.

For example, in the method for manufacturing the array substrate provided by an embodiment of the present disclosure, the metal conductive portion includes a first electrode and a second electrode, the first electrode and the second electrode are opposite and are electrically connected to the active layer, respectively, and forming the cover layer covering the array substrate on a side, away from the base substrate, of the active layer, includes: forming a metal layer covering the array substrate on a side, away from the base substrate, of the active layer; forming a shielding layer corresponding to a region of the first electrode and a region of the second electrode on a side, away from the active layer, of the metal layer; processing the array substrate to allow a region, which is not covered by the shielding layer, of the metal layer to be converted into a transparent insulating metal oxide; and stripping off the shielding layer.

For example, in the method for manufacturing the array substrate provided by an embodiment of the present disclosure, the metal conductive portion further includes a data line, the first electrode is a source electrode, the second electrode is a drain electrode, the data line is electrically connected to the source electrode, and forming the cover layer covering the array substrate on a side, away from the base substrate, of the active layer further includes: forming a shielding layer corresponding to a region of the data line on a side, away from the active layer, of the metal layer.

For example, in the method for manufacturing the array substrate provided by an embodiment of the present disclosure, processing the array substrate to allow the region, which is not covered by the shielding layer, of the metal layer to be converted into a transparent insulating metal oxide, includes: performing an oxygen plasma bombardment on the array substrate to allow the region, which is not covered by the shielding layer, of the metal layer to be converted into the transparent insulating metal oxide.

For example, in the method for manufacturing the array substrate provided by an embodiment of the present disclosure, the shielding layer is a photoresist layer.

For example, in the method for manufacturing the array substrate provided by an embodiment of the present disclosure, a material of the metal layer includes Hf, and the transparent insulating metal oxide includes $HfO_2$; or a material of the metal layer includes Ta, and the transparent insulating metal oxide includes $Ta_2O_5$.

For example, in the method for manufacturing the array substrate provided by an embodiment of the present disclosure, a material of the active layer includes a metal oxide semiconductor, and the metal oxide semiconductor includes indium gallium zinc oxide, zinc oxide, or zinc oxynitride.

For example, the method for manufacturing the array substrate provided by an embodiment of the present disclosure further includes: forming a gate electrode and a gate line electrically connected to the gate electrode on the base substrate, and forming a gate insulating layer on a side, away from the base substrate, of the gate electrode and the gate line; and the active layer is formed on a side, away from the gate electrode, of the gate insulating layer.

For example, the method for manufacturing the array substrate provided by an embodiment of the present disclosure further includes: forming a passivation layer on a side, away from the active layer, of the cover layer.

At least an embodiment of the present disclosure further provides a thin film transistor, and the thin film transistor includes: an active layer, a metal conductive portion, and a transparent insulating metal oxide portion; and the metal conductive portion and the transparent insulating metal oxide portion include an identical metal element, the metal conductive portion includes a first electrode and a second electrode, and the first electrode and the second electrode are opposite and are electrically connected to the active layer, respectively.

For example, in the thin film transistor provided by an embodiment of the present disclosure, the metal conductive portion includes Hf, and the transparent insulating metal oxide portion includes $HfO_2$; or the metal conductive portion includes Ta, and the transparent insulating metal oxide portion includes $Ta_2O_5$.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Main steps of a process for manufacturing an array substrate include: glass substrate cleaning→film coating→cleaning→photoresist coating→exposure→development→etching→photoresist stripping-off→cleaning→inspection. The film coating includes a metal film coating and a non-metal film coating. The metal film is formed by physical vapor deposition, which is also referred to as sputtering; and the non-metal film is formed by chemical vapor deposition. The photoresist coating refers to the process of uniformly coating the photoresist to the surface of the glass substrate. The exposure is to transfer the pattern on the mask to the glass substrate on which the photoresist is coated, and the exposure requires extremely high accuracy. The photoresist includes a positive photoresist and a negative photoresist. The development is to dissolve and remove the photosensitive part of the photoresist after the positive photoresist is exposed, and leave the non-photosensitive part of the photoresist, thereby forming a pattern. Alternatively, the development is to leave the photosensitive part of the photoresist after the negative photoresist is exposed, and dissolve and remove the non-photosensitive part of the photoresist, thereby forming a pattern. The photoresist left subsequent to the development becomes a protection mask, and the unprotected thin film is removed by the etching process. The photoresist stripping-off refers to removing the photoresist after the etching process.

In the manufacturing process of the array substrate, the etching process is provided. In the etching process of the thin film transistor (TFT), back-channel etching is usually used because of the simple process. Currently, most TFTs are manufactured by using indium gallium zinc oxide (IGZO) with high carrier mobility to form the active layer. However, in the case where IGZO is used to form the active layer, if the back-channel etching is used to form the source electrode and the drain electrode, the etching solution may inevitably damage the formed IGZO active layer, thereby seriously affecting the characteristics of the TFT.

At least an embodiment of the present disclosure provides an array substrate, a display device, a thin film transistor, and a method for manufacturing an array substrate. The array substrate can prevent the etching solution from damaging the active layer, and can significantly optimize the characteristics of the TFT.

Hereinafter, the embodiments of the present disclosure are described in detail with reference to the accompanying drawings. It should be noted that the same reference numerals in different drawings are used to refer to the same described components, respectively.

At least an embodiment of the present disclosure provides an array substrate, and the array substrate includes a base substrate, an active layer, and a cover layer. The active layer is located on the base substrate, and the cover layer is located on a side, away from the base substrate, of the active layer and covers the array substrate. The cover layer includes a metal conductive portion and a transparent insulating metal oxide portion, the metal conductive portion and the transparent insulating metal oxide portion include an identical metal element, and the metal conductive portion is electrically connected to the active layer.

Figure 2:
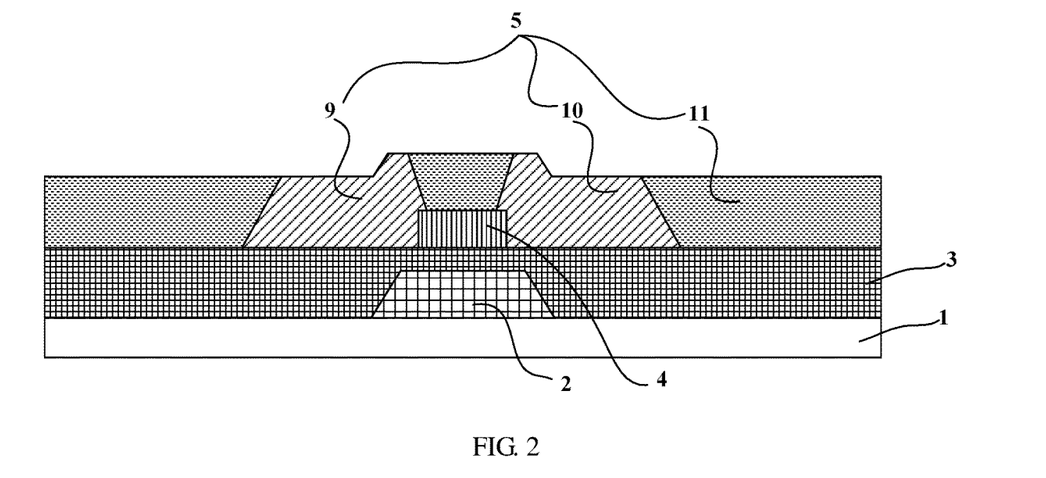
FIG. 2 is a schematic diagram of an array substrate provided by at least an embodiment of the present disclosure.

FIG. 2 is a schematic diagram of an array substrate provided by at least an embodiment of the present disclosure. As illustrated in FIG. 2, the array substrate provided by some embodiments of the present disclosure includes: a base substrate 1, a gate electrode 2 on the base substrate 1 and a gate line (not shown) electrically connected to the gate electrode 2, a gate insulating layer 3 on a side, away from the base substrate 1, of the gate electrode 2 and the gate line, an active layer 4 on a side, away from the gate electrode 2, of the gate insulating layer 3, and a cover layer 5 on a side, away from the gate insulating layer 3 (i.e., away from the base substrate 1), of the active layer 4 and covering the array substrate. The cover layer 5 includes a metal conductive portion and a transparent insulating metal oxide portion 11, and the metal conductive portion and the transparent insulating metal oxide portion 11 include an identical metal element. The metal conductive portion includes a first electrode 9 (e.g. a source electrode) and a second electrode 10 (e.g. a drain electrode) which are opposite and electrically connected to the active layer 4, respectively.

For example, in some embodiments of the present disclosure, the metal conductive portion may further include, for example, a data line. In the case where the first electrode 9 is a source electrode and the second electrode 10 is a drain electrode, the data line is electrically connected to the source electrode 9 (i.e., the first electrode).

It should be noted that, in the embodiments, the first electrode 9 is a source electrode, and the second electrode 10 is a drain electrode. In other embodiments of the present disclosure, the first electrode 9 may be a drain electrode, and the second electrode 10 is a source electrode. The embodiments of the present disclosure are not limited in this aspect.

For example, the metal conductive portion may further include a signal line for transmitting other electrical signals, and the signal line may be electrically connected to the first electrode 9 or may be electrically connected to the second electrode 10. The connection method may be direct connection or connection through a structure such as a via hole structure, and the embodiments of the present disclosure are not limited in this aspect.

For example, in other embodiments of the present disclosure, the data line or the signal line for transmitting other electrical signals may also be prepared by using other materials or other processes, that is, the metal conductive portion may not include signal lines such as the data line. The embodiments of the present disclosure are not limited in this aspect.

In some embodiments of the present disclosure, the specific material of the base substrate 1 is not limited, and for example, may use glass, resin, or plastic. For example, the base substrate 1 may be a transparent glass substrate or a transparent plastic substrate.

For example, the metal conductive portion (such as the first electrode 9 and the second electrode 10) of the cover layer 5 and the transparent insulating metal oxide portion 11 include the same metal element, and therefore the metal conductive portion and the transparent insulating metal oxide portion 11 may be obtained, for example, by forming a metal layer including the same metal element and performing an oxygen plasma bombardment on the metal layer, thereby eliminating the etching process in the manufacturing process of the array substrate, avoiding the etching solution from damaging the active layer 4 during the wet etching process, and allowing the characteristics of the TFT to be significantly optimized.

Figure 1:
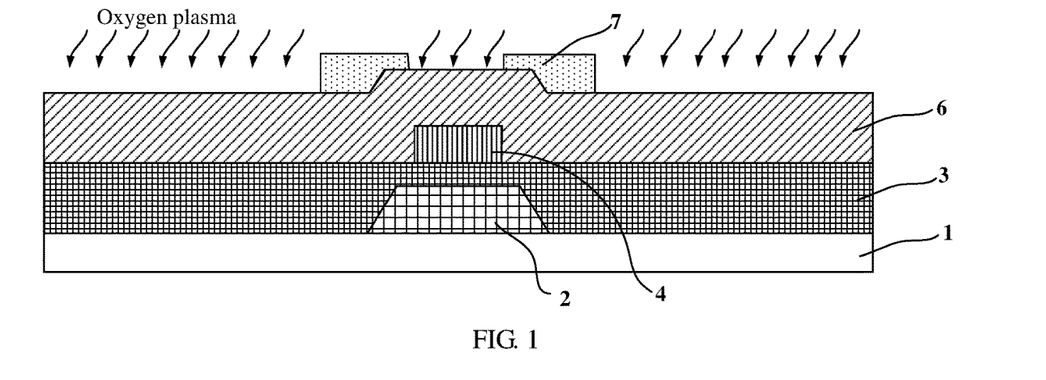
FIG. 1 is a schematic diagram of performing an oxygen plasma bombardment on an array substrate during manufacturing the array substrate provided by at least an embodiment of the present disclosure.

FIG. 1 is a schematic diagram of performing an oxygen plasma bombardment on an array substrate during manufacturing the array substrate provided by at least an embodiment of the present disclosure. For example, as illustrated in FIG. 1 and FIG. 2, in some embodiments of the present disclosure, the manufacturing process of the cover layer 5 may include: forming a metal layer 6 covering the array substrate on a side, away from the base substrate 1, of the active layer 4; forming a shielding layer 7 corresponding to a region of the first electrode 9 (for example, the source electrode) and a region of the second electrode 10 (for example, the drain electrode) on a side, away from the active layer 4, of the metal layer 6; performing an oxygen plasma bombardment on the array substrate to allow the region, which is not covered by the shielding layer 7, of the metal layer 6 to be converted into a transparent insulating metal oxide, that is, the transparent insulating metal oxide portion 11; and stripping off the shielding layer 7.

For example, in the case where the metal conductive portion of the array substrate includes the data line as illustrated in FIG. 2, the manufacturing process of the cover layer 5 further includes: forming the shielding layer 7 corresponding to a region of the data line on a side, away from the active layer 4, of the metal layer 6.

In some embodiments of the present disclosure, a material of the metal layer 6, that is, a material of the metal conductive portion, may be, for example, hafnium (Hf), and a material of the transparent insulating metal oxide portion 11 is $HfO_2$. Alternatively, for example, the material of the metal layer 6 may be Tantalum (Ta), and the material of the transparent insulating metal oxide portion 11 is $Ta_2O_5$. For example, the material of the metal layer 6 may also be a mixture of Hf and Ta, and accordingly, the material of the transparent insulating metal oxide portion 11 is a mixture of $HfO_2$ and $Ta_2O_5$. For example, the material of the metal layer 6 may also be other metal elements, and the material of the transparent insulating metal oxide portion 11 is a corresponding oxide of the metal element or other types of compounds of the metal element. The embodiments of the present disclosure are not limited in this aspect.

For example, the metal Hf has an excellent electrical conductivity and is very stable at the normal temperature, and further, Hf can be oxidized to form the transparent metal oxide $HfO_2$ at high temperature. $HfO_2$ is a ceramic material with a wide band gap and a high dielectric constant, and can be a good substitute for insulating materials such as silicon oxide. Therefore, after the exposure and development of the metal layer 6 of the array substrate, the Hf that is not protected by the shielding layer 7 in the metal layer 6 is converted into $HfO_2$, thereby implementing the patterning process. Therefore, the array substrate provided by the embodiments of the present disclosure can prevent the etching solution from damaging the active layer during the wet etching process, thereby significantly optimizing the characteristics of the TFT and improving the yield of products including the array substrate.

For example, the shielding layer 7 may be a photoresist layer, and may be, for example, a photopolymerization photoresist layer, a photolysis photoresist layer, a photo-crosslinking photoresist layer, or the like. For example, the shielding layer 7 may also use other types of materials, and the embodiments of the present disclosure are not limited in this aspect.

In some embodiments of the present disclosure, the active layer 4 may be formed of a semiconductor material, and for example, the material of the active layer 4 may be amorphous silicon, microcrystalline silicon, polysilicon, an oxide semiconductor (such as a metal oxide semiconductor), etc. The metal oxide semiconductor includes indium gallium zinc oxide (IGZO), zinc oxide (ZnO), or zinc oxynitride (ZnON), and the metal oxide semiconductor has a high carrier mobility and can satisfy the driving requirements of a display device with a large size, so that the metal oxide semiconductor is widely used in manufacturing the TFT. For example, the region of the active layer 4 that is in contact with the first electrode 9 and the second electrode 10 can be conductive by the processes of plasma processing and high temperature processing, so that the transmission of electrical signals can be better implemented.

For example, a material of the gate electrode 2 and the gate line may be a copper-based metal, such as copper (Cu), copper-molybdenum alloy (Cu/Mo), copper-titanium alloy (Cu/Ti), copper-molybdenum-titanium alloy (Cu/Mo/Ti), copper-molybdenum-wolfram alloy (Cu/Mo/W), copper-molybdenum-niobium alloy (Cu/Mo/Nb), etc., and may also be a chromium-based metal, such as chromium-molybdenum alloy (Cr/Mo), chromium-titanium alloy (Cr/Ti), chromium-molybdenum-titanium alloy (Cr/Mo/Ti), or other suitable materials.

For example, a material of the gate insulating layer 3 may be silicon nitride (SiNx), silicon oxide (SiOx), aluminum oxide ($Al_2O_3$), aluminum nitride (AlN), or other suitable materials.

Figure 3:
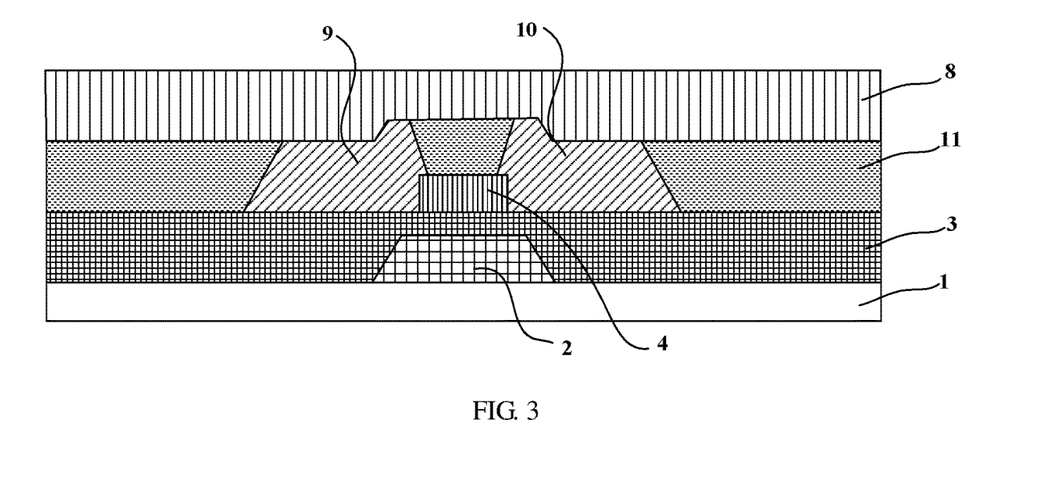
FIG. 3 is a schematic diagram of another array substrate provided by at least an embodiment of the present disclosure.

FIG. 3 is a schematic diagram of another array substrate provided by at least an embodiment of the present disclosure. As illustrated in FIG. 3, the array substrate provided by some embodiments of the present disclosure further includes a passivation layer 8 on a side, away from the active layer 4, of the cover layer 5. A material of the passivation layer 8 may be an organic insulating material (for example, an acrylic resin) or an inorganic insulating material (for example, silicon nitride or silicon oxide). For example, the passivation layer 8 may be a single-layer structure composed of silicon nitride or silicon oxide, or a double-layer structure composed of silicon nitride and silicon oxide, and the embodiments of the present disclosure are not limited in this aspect.

For example, because the metal layer 6 where the first electrode 9 and the second electrode 10 are located does not need to be formed by the etching process, but may be formed by, for example, deposition (such as sputtering deposition), the metal layer 6 may be a continuous surface, so that the height difference from the first electrode 9 and the second electrode 10 to the passivation layer 8 is effectively reduced, thereby significantly improving the yield of products including the array substrate.

It should be noted that in some embodiments of the present disclosure, the array substrate is described by taking a bottom gate structure as an example, that is, the gate electrode and the gate line electrically connected to the gate electrode are both disposed on a side, close to the base substrate, of the active layer. In other embodiments of the present disclosure, the array substrate may also adopt other types of structures, and the embodiments of the present disclosure are not limited in this aspect.

For example, in the case where the array substrate provided by the embodiments of the present disclosure is applied to, for example, a device having a display function, a plurality of pixel units in an array arrangement may also be provided on the array substrate.

Figure 4:
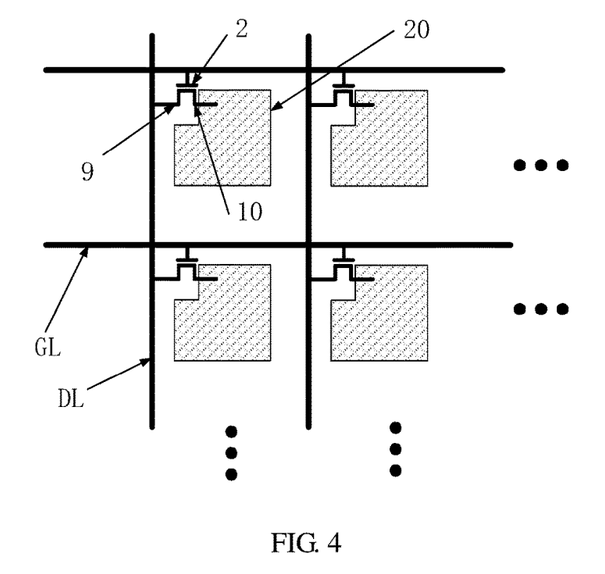
FIG. 4 is a schematic diagram of a planar structure of pixel units of an array substrate provided by at least an embodiment of the present disclosure.

FIG. 4 is a schematic diagram of a planar structure of pixel units of an array substrate provided by at least an embodiment of the present disclosure. As illustrated in FIG. 4, a plurality of pixel units 20 are disposed in an area defined by a plurality of data lines DL and a plurality of gate lines GL on the array substrate. For example, each pixel unit 20 includes a switching transistor, the switching transistor includes a gate electrode 2, a first electrode 9 (e.g. a source electrode), and a second electrode 10 (e.g. a drain electrode), the gate electrode 2 of the switching transistor is electrically connected to the gate line GL, the first electrode 9 of the switching transistor is electrically connected to the data line DL, and the second electrode 10 of the switching transistor is electrically connected to other components, such as a driving transistor, in the pixel unit 20.

At least an embodiment of the present disclosure further provides a display device, and the display device includes the array substrate according to any one of the embodiments of the present disclosure. Because the TFT in the array substrate has a better performance, the display device has a better product quality. The technical effects and implementation principles of the display device are the same as those of the array substrate described in the embodiments of the present disclosure, and details are not described herein again. The specific type of the display device is not limited, and for example, the display device may be a TFT-LCD display device, an AMOLED display device, etc. The specific product type of the display device is not limited, and for example, the display device may be any product or component with a display function, such as an electronic paper, a mobile phone, a display, a display screen, a tablet television, a tablet computer, a laptop computer, a digital photo frame, a navigator, etc.

At least an embodiment of the present disclosure further provides a method for manufacturing an array substrate, including: forming an active layer on a base substrate, and forming a cover layer covering the array substrate on a side, away from the base substrate, of the active layer. The cover layer includes a metal conductive portion and a transparent insulating metal oxide portion, the metal conductive portion and the transparent insulating metal oxide portion include an identical metal element, and the metal conductive portion is electrically connected to the active layer.

In the following, the method for manufacturing the array substrate is described by taking the array substrate illustrated in FIG. 2 as an example.

Figure 5:
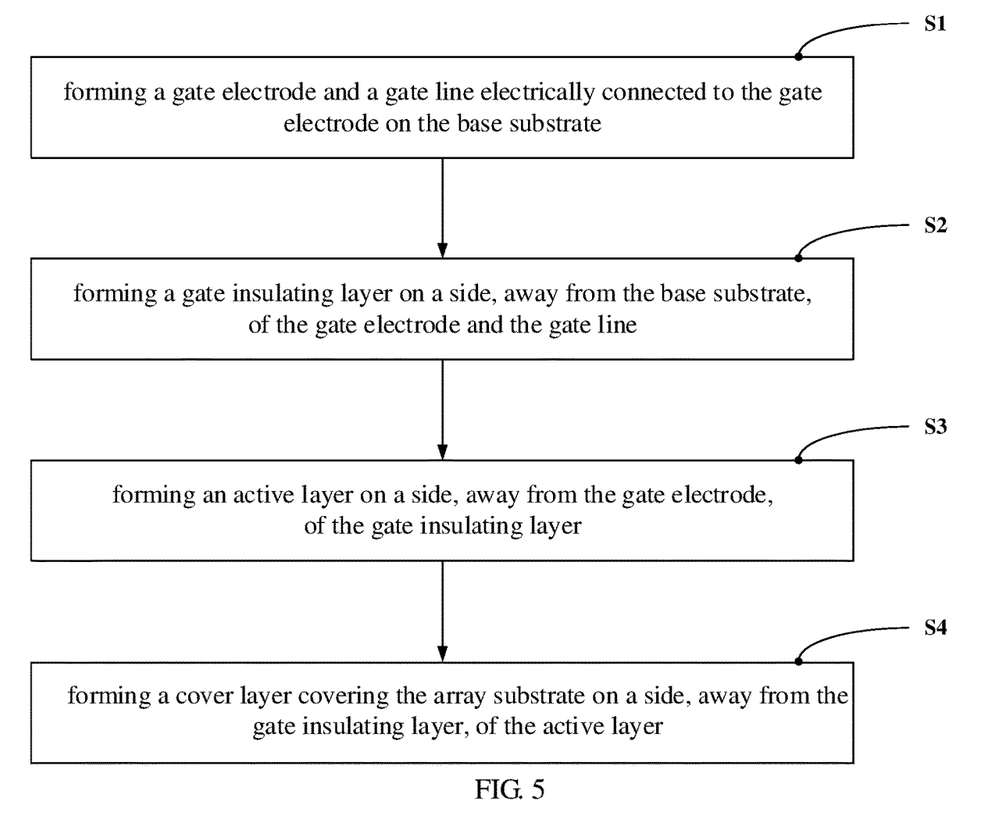
FIG. 5 is a flowchart of a method for manufacturing an array substrate provided by at least an embodiment of the present disclosure.

FIG. 5 is a flowchart of a method for manufacturing an array substrate provided by at least an embodiment of the present disclosure. With reference to FIG. 2 and FIG. 5, the method for manufacturing the array substrate provided by some embodiments of the present disclosure includes the following steps.

Step S1: forming a gate electrode 2 and a gate line electrically connected to the gate electrode 2 on the base substrate 1.

Step S2: forming a gate insulating layer 3 on a side, away from the base substrate 1, of the gate electrode 2 and the gate line.

Step S3: forming an active layer 4 on a side, away from the gate electrode 2, of the gate insulating layer 3.

Step S4: forming a cover layer 5 covering the array substrate on a side, away from the gate insulating layer 3 (i.e., away from the base substrate 1), of the active layer 4.

The cover layer 5 includes a metal conductive portion and a transparent insulating metal oxide portion 11, and the metal conductive portion and the transparent insulating metal oxide portion 11 have an identical metal element. The metal conductive portion includes a source electrode (i.e., the first electrode 9) and a drain electrode (i.e., the second electrode 10) which are opposite and electrically connected to the active layer 4, respectively, and further includes a data line electrically connected to the source electrode 9.

For example, in steps S1 and S2, the gate electrode 2 and the gate insulating layer 3 may be patterned by using one same patterning process. For example, the gate insulating layer 3 may be an inorganic insulating layer or an organic insulating layer, and may be formed by a method such as physical vapor deposition, chemical vapor deposition, or coating.

For example, in step S3, the active layer 4 may be formed by amorphous silicon, polysilicon, an oxide semiconductor, etc., and is patterned by, for example, a photolithography process.

Figure 6:
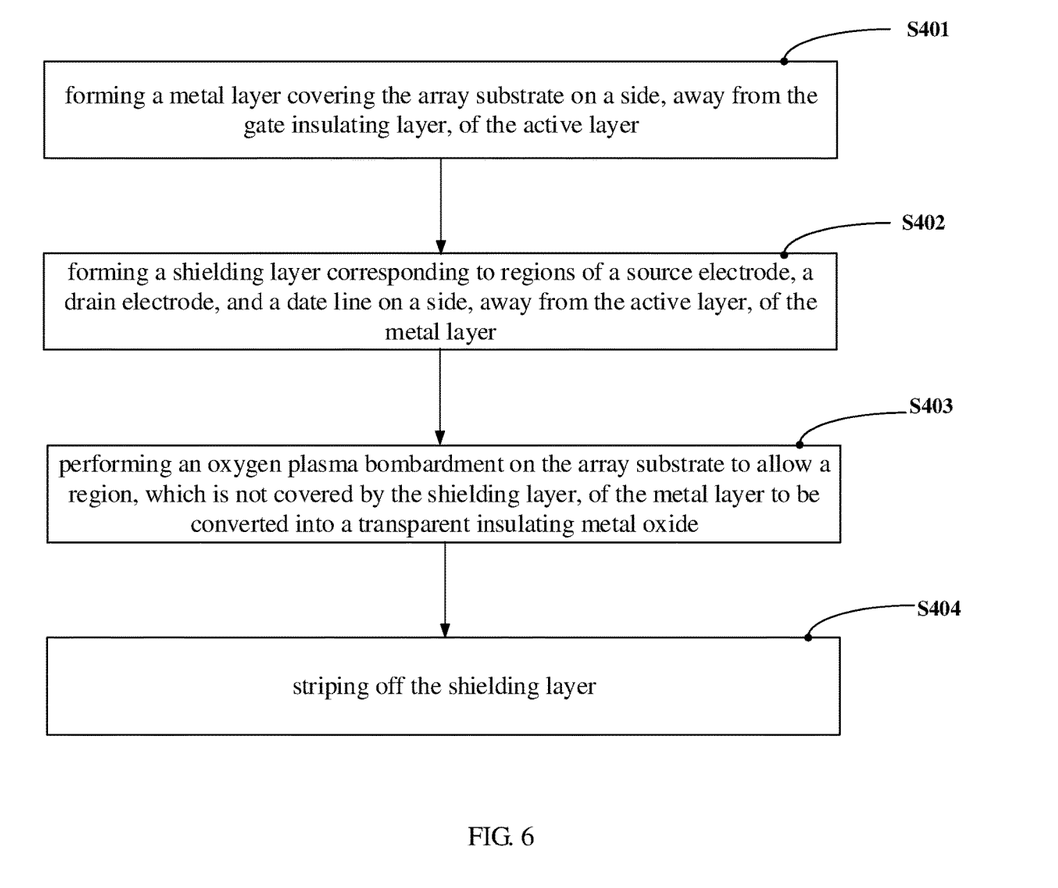
FIG. 6 is a flowchart of a method for manufacturing a cover layer of an array substrate provided by at least an embodiment of the present disclosure.

FIG. 6 is a flowchart of a method for manufacturing a cover layer of an array substrate provided by at least an embodiment of the present disclosure. With reference to FIG. 1, FIG. 2 and FIG. 6, in the method for manufacturing the array substrate provided by some embodiments of the present disclosure, forming the cover layer 5 covering the array substrate on a side, away from the gate insulating layer 3, of the active layer 4 includes the following steps.

Step S401: forming a metal layer 6 covering the array substrate on a side, away from the gate insulating layer 3 (i.e., away from the base substrate 1), of the active layer 4.

Step S402: forming a shielding layer 7 corresponding to regions of the source electrode (i.e., the first electrode 9), the drain electrode (i.e., the second electrode 10), and the data line on a side, away from the active layer 4, of the metal layer 6.

Step S403: performing an oxygen plasma bombardment on the array substrate to allow a region, which is not covered by the shielding layer 7, of the metal layer 6 to be oxidized into a transparent insulating metal oxide (i.e., the transparent insulating metal oxide portion 11).

Step S404: stripping off the shielding layer 7.

For example, in step S403, the region, which is not covered by the shielding layer 7, of the metal layer 6 can be oxidized into the transparent insulating metal oxide by performing the oxygen plasma bombardment on the array substrate. In other embodiments of the present disclosure, the region, which is not covered by the shielding layer 7, of the metal layer 6 may also be converted into the transparent insulating metal oxide by other processing methods, and the embodiments of the present disclosure are not limited in this aspect.

For the array substrate manufactured by the method provided by the embodiments, after the shielding layer covering the regions corresponding to the source electrode, the drain electrode, and the data line is formed on a side, away from the active layer, of the metal layer, the oxygen plasma bombardment is performed on the array substrate to allow the region, which is not covered by the shielding layer, of the metal layer to be oxidized into the transparent insulating metal oxide, so that after the shielding layer of the array substrate is striped off, the array substrate is provided with a pattern corresponding to the regions of the source electrode, the drain electrode, and the data line. This patterning process avoids the damage to the active layer through the etching process, optimizes the characteristics of the TFT, and improves the product quality of the display device including the array substrate.

For example, the shielding layer 7 may be a photoresist layer.

For example, in some other embodiments of the present disclosure, in the case where the metal conductive portion does not include the data line, for example, the data line may be additionally provided through other materials or process methods, that is, the data line may not be formed through the above-mentioned manufacturing method. The embodiments of the present disclosure are not limited in this aspect.

For example, with reference to the array substrate illustrated in FIG. 3, the method for manufacturing the array substrate provided by some embodiments of the present disclosure may further include: forming a passivation layer 8 on a side, away from the active layer 4, of the cover layer 5.

For example, the material of the passivation layer 8 may be silicon nitride, silicon oxide, or the like. For example, the passivation layer 8 may be formed by a method such as physical vapor deposition, chemical vapor deposition, or coating.

For example, in the array substrate manufactured by the method provided by the embodiments of the present disclosure, the material of the metal layer 6 of the array substrate may be Hf, and the transparent insulating metal oxide (that is, the material of the transparent insulating metal oxide portion 11) is $HfO_2$. Alternatively, the material of the metal layer 6 may be Ta, and the transparent insulating metal oxide (that is, the material of the transparent insulating metal oxide portion 11) is $Ta_2O_5$.

For example, the material of the metal layer 6 may also be a mixture of Hf and Ta, and accordingly, the material of the transparent insulating metal oxide portion 11 is a mixture of $HfO_2$ and $Ta_2O_5$. For example, the material of the metal layer 6 may also be other metal elements, and the material of the transparent insulating metal oxide portion 11 is a corresponding oxide of the metal element or other types of compounds of the metal element. The embodiments of the present disclosure are not limited in this aspect.

For example, in the array substrate manufactured by the method provided by the embodiments of the present disclosure, the material of the active layer 4 may be a metal oxide semiconductor. The metal oxide semiconductor includes indium gallium zinc oxide (IGZO), zinc oxide (ZnO), zinc oxynitride (ZnON), or the like, and such metal oxide semiconductors are widely used in manufacturing the TFT because of the high carrier mobility.

At least an embodiment of the present disclosure further provides a thin film transistor, and the thin film transistor includes: an active layer, a metal conductive portion, and a transparent insulating metal oxide portion. The metal conductive portion and the transparent insulating metal oxide portion include an identical metal element, the metal conductive portion includes a first electrode and a second electrode, and the first electrode and the second electrode are opposite and are electrically connected to the active layer, respectively.

For example, in some embodiments of the present disclosure, the metal conductive portion includes Hf, and the transparent insulating metal oxide portion includes $HfO_2$.

For example, in some embodiments of the present disclosure, the metal conductive portion includes Ta, and the transparent insulating metal oxide portion includes $Ta_2O_5$.

For example, in some embodiments of the present disclosure, the thin film transistor further includes a gate electrode, and the gate electrode is insulated from the active layer and corresponds to the active layer.

The thin film transistor provided by at least an embodiment of the present disclosure may be used in an array substrate as a switching component in a pixel unit, and may also be used in other electronic devices as, for example, a switching component or a driving component for such as a gate driving circuit (e.g. a gate on array-substrate (GOA) circuit), and the embodiments of the present disclosure are not limited in this aspect. The technical effects and implementation principles of the thin film transistor are the same as those of the array substrate described in at least an embodiment of the present disclosure, and details are not described herein again.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

What is claimed is:

1. An array substrate, comprising: a base substrate, an active layer, and a cover layer,
    wherein the active layer is on the base substrate, the cover layer is on a side, away from the base substrate, of the active layer and covers the array substrate,
    the cover layer comprises a metal conductive portion and a transparent insulating metal oxide portion, the metal conductive portion and the transparent insulating metal oxide portion comprise an identical metal element,
    the metal conductive portion is electrically connected to the active layer,
    the metal conductive portion comprises a first electrode and a second electrode,
    the first electrode and the second electrode are opposite and are electrically connected to the active layer,
    a surface of a side, away from the base substrate, of the first electrode, does not include a portion covered by the transparent insulating metal oxide portion, and
    a surface of a side, away from the base substrate, of the second electrode, does not include a portion covered by the transparent insulating metal oxide portion.

2. The array substrate according to claim 1, wherein the metal conductive portion further comprises a data line,
    the first electrode is a source electrode, the second electrode is a drain electrode, and the data line is electrically connected to the source electrode.

3. The array substrate according to claim 1, further comprising a gate electrode, a gate line, and a gate insulating layer,
    wherein the gate electrode is on the base substrate and is electrically connected to the gate line,
    the gate insulating layer is on a side, away from the base substrate, of the gate electrode and the gate line, and
    the active layer is on a side, away from the gate electrode, of the gate insulating layer.

4. The array substrate according to claim 1, wherein the metal conductive portion of the cover layer comprises Hf, and the transparent insulating metal oxide portion of the cover layer comprises $HfO_2$.

5. The array substrate according to claim 1, wherein the metal conductive portion of the cover layer comprises Ta, and the transparent insulating metal oxide portion of the cover layer comprises $Ta_2O_5$.

6. The array substrate according to claim 1, wherein a material of the active layer comprises a metal oxide semiconductor, and
    the metal oxide semiconductor comprises indium gallium zinc oxide, zinc oxide, or zinc oxynitride.

7. The array substrate according to claim 1, further comprising a passivation layer, wherein the passivation layer is on a side, away from the active layer, of the cover layer.

8. A display device, comprising the array substrate according to claim 1.

9. A method for manufacturing an array substrate, comprising:
    forming an active layer on a base substrate; and
    forming a cover layer covering the array substrate on a side, away from the base substrate, of the active layer,
    wherein the cover layer comprises a metal conductive portion and a transparent insulating metal oxide portion, the metal conductive portion and the transparent insulating metal oxide portion comprise an identical metal element, and the metal conductive portion is electrically connected to the active layer, and
    the metal conductive portion comprises a first electrode and a second electrode, the first electrode and the second electrode are opposite and are electrically connected to the active layer, respectively, and
    the forming the cover layer covering the array substrate on the side, away from the base substrate, of the active layer, comprises:
        forming a metal layer covering the array substrate on the side, away from the base substrate, of the active layer;
        forming a shielding layer corresponding to a region of the first electrode and a region of the second electrode on a side, away from the active layer, of the metal layer;
        processing the array substrate to allow a region, which is not covered by the shielding layer, of the metal layer to be converted into a transparent insulating metal oxide; and
        stripping off the shielding layer.

10. The method for manufacturing the array substrate according to claim 9, wherein the metal conductive portion further comprises a data line,
the first electrode is a source electrode, the second electrode is a drain electrode, the data line is electrically connected to the source electrode, and
the forming the cover layer covering the array substrate on the side, away from the base substrate, of the active layer further comprises:
forming a shielding layer corresponding to a region of the data line on the side, away from the active layer, of the metal layer.

11. The method for manufacturing the array substrate according to claim 9, wherein the processing the array substrate to allow the region, which is not covered by the shielding layer, of the metal layer to be converted into the transparent insulating metal oxide, comprises:
performing an oxygen plasma bombardment on the array substrate to allow the region, which is not covered by the shielding layer, of the metal layer to be converted into the transparent insulating metal oxide.

12. The method for manufacturing the array substrate according to claim 9, wherein the shielding layer is a photoresist layer.

13. The method for manufacturing the array substrate according to claim 9, wherein a material of the metal layer comprises Hf, and the transparent insulating metal oxide comprises $HfO_2$; or
a material of the metal layer comprises Ta, and the transparent insulating metal oxide comprises $Ta_2O_5$.

14. A method for manufacturing an array substrate, comprising:
forming an active layer on a base substrate; and
forming a cover layer covering the array substrate on a side, away from the base substrate, of the active layer,
wherein the cover layer comprises a metal conductive portion and a transparent insulating metal oxide portion, the metal conductive portion and the transparent insulating metal oxide portion comprise an identical metal element, and the metal conductive portion is electrically connected to the active layer, and
the metal conductive portion and the transparent insulating metal oxide portion are formed through processing an identical metal layer.

15. The method for manufacturing the array substrate according to claim 14, wherein a material of the active layer comprises a metal oxide semiconductor, and
the metal oxide semiconductor comprises indium gallium zinc oxide, zinc oxide, or zinc oxynitride.

16. The method for manufacturing the array substrate according to claim 14, further comprising:
forming a gate electrode and a gate line electrically connected to the gate electrode on the base substrate, and
forming a gate insulating layer on a side, away from the base substrate, of the gate electrode and the gate line,
wherein the active layer is formed on a side, away from the gate electrode, of the gate insulating layer.

17. The method for manufacturing the array substrate according to claim 14, further comprising:
forming a passivation layer on a side, away from the active layer, of the cover layer.

18. The method for manufacturing the array substrate according to claim 14, wherein a material of the identical metal layer comprises Hf, and the transparent insulating metal oxide portion comprises $HfO_2$; or
a material of the identical metal layer comprises Ta, and the transparent insulating metal oxide portion comprises $Ta_2O_5$.

* * * * *